(12) United States Patent
Burns

(10) Patent No.: US 8,587,314 B2
(45) Date of Patent: Nov. 19, 2013

(54) SUSPENDED SUBSTRATE CIRCUITS AND NUCLEAR MAGNETIC RESONANCE PROBES UTILIZING SAME

(75) Inventor: Sean T. Burns, Menlo Park, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 330 days.

(21) Appl. No.: 13/031,907

(22) Filed: Feb. 22, 2011

(65) Prior Publication Data
US 2012/0212224 A1 Aug. 23, 2012

(51) Int. Cl.
*G01R 33/44* (2006.01)
(52) U.S. Cl.
USPC .............................. 324/318; 324/32
(58) Field of Classification Search
USPC .......................................... 324/318
See application file for complete search history.

(56) References Cited

U.S. PATENT DOCUMENTS

| | | | |
|---|---|---|---|
| 4,755,778 A | 7/1988 | Chapell | 333/159 |
| 6,667,674 B2 | 12/2003 | de Swiet et al. | 333/219 |
| 6,822,532 B2 | 11/2004 | Kane et al. | 333/116 |
| 7,081,753 B2 | 7/2006 | Mullen et al. | 324/318 |
| 7,288,939 B1 | 10/2007 | Barbara et al. | 324/322 |
| 7,436,182 B1 | 10/2008 | Hudson et al. | 324/322 |
| 7,446,388 B2 | 11/2008 | Casper et al. | 257/528 |
| 7,446,532 B1 | 11/2008 | Burns | 324/318 |
| 7,598,738 B2 | 10/2009 | Kupce | 324/307 |
| 7,701,219 B2 | 4/2010 | Finnigan et al. | |
| 7,714,579 B2 | 5/2010 | Suematsu et al. | 324/318 |
| 7,812,606 B2 | 10/2010 | Burns | 324/318 |
| 2007/0108980 A1* | 5/2007 | Adriany et al. | 324/318 |

OTHER PUBLICATIONS

Brown et al., "A Varactor Tuned RF Filter", *IEEE Trans. Microwave Theory Tech.*, vol. 48, No. 7, pp. 1157-1160 (Jul. 2000).
"Expanding the frontier of thin film innovation", UltraSource, Brochure, 12 pgs (2005).

* cited by examiner

*Primary Examiner* — Melissa Koval
*Assistant Examiner* — Rishi Patel

(57) ABSTRACT

A nuclear magnetic resonance (NMR) probe circuit assembly includes one or more probe circuits in signal communication with one or more respective sample coils configured for transmitting and/or receiving radio-frequency (RF) energy to and/or from a sample of interest. One or more of the probe circuits have a suspended substrate configuration in which variable capacitors share a common dielectric substrate that is separated from a ground plane by an air gap. Each variable capacitor includes an electrode that is movable by a user-actuated adjusting device. One or more of the probe circuits may have a multiply resonant or broadband configuration, and may have one or more individual channels. One or more of the variable capacitors enable tuning to resonant frequencies of selected nuclei. One or more other variable capacitors may enable impedance matching.

20 Claims, 9 Drawing Sheets

SUSPENDED SUBSTRATE CIRCUITS AND NUCLEAR MAGNETIC RESONANCE PROBES UTILIZING SAME

TECHNICAL FIELD

The present invention relates generally to nuclear magnetic resonance (NMR) probes and circuitry utilized in NMR probes, particularly circuitry utilized for impedance matching and frequency tuning.

BACKGROUND

In a nuclear magnetic resonance (NMR) spectrometer, a sample is positioned in an NMR probe that is located in a bore of a (typically superconducting) magnet and immersed in a high-strength (typically several Tesla) static magnetic field $B_0$ generated by the magnet. In the magnet bore, the sample is surrounded by one or more sample coils. These coils apply a pulsed magnetic field $B_1$ (typically orthogonal to the $B_0$ field) oscillating in the radio frequency (RF) range (e.g., 40-900 MHz) to the sample. The coils are tuned to resonantly excite one or more desired types of NMR-active nuclei of the sample. The resonance condition is fulfilled if the frequency of the applied RF energy equals the resonance (or Larmor) frequency $v_0$ of the NMR-active nucleus being irradiated, which depends on the type of nucleus and the strength of the $B_0$ field. At resonance, the $B_1$ field efficiently transfers electromagnetic energy to the nucleus and causes a change in energy state. During the delay interval between pulses the nucleus emits an RF time-domain signal, known as a free-induction decay (FID), as a result of this perturbation. The FID decays in the interval as the excited nucleus relaxes back to its equilibrium state. The FID is picked up as an NMR response signal by the coil (the same coil utilized for excitation or a different coil). Electronics of the NMR spectrometer amplify and process the NMR response signal, including converting the signal from the time domain to frequency domain by Fourier transformation, to yield an NMR spectrum in the frequency domain. The spectrum consists of one or more peaks whose intensities represent the proportions of each frequency component detected. Thus, NMR spectra can provide useful information indicative of molecular structure, position, and abundance in chemical, biochemical, and biological species of interest.

The NMR probe includes the coil(s) and an NMR probe circuit. The NMR probe circuit provides RF communication between the coil(s) and the associated electronics of the NMR spectrometer (e.g., RF transmitting and receiving circuitry). The NMR probe circuit may be configured to provide more than one probe channel, with each probe channel being configured for resonantly exciting a different type of nucleus. In general, an NMR probe circuit serves to impedance-match the sample coil at one or more resonance frequencies, provide tuning in a narrow band near (below and above) these frequencies, and isolate different probe channels from one another. An NMR probe will usually have two sample coils that are coaxially nested around the sample. In one common configuration each sample coil is doubly resonated, resulting in a total of four resonances (channels) in the probe, while in other configurations more or less channels are possible. As noted above, each resonance corresponds to the Larmor frequency of a nucleus of interest contained in the sample. One of the channels, however, may be tuned for irradiating the deuterium ($^2$H, or "D") species of a "lock solvent" to produce a reference signal utilized for offsetting the drift of the $B_0$ field (deuterium field-frequency locking, or deuterium locking). Environmental variables such as sample solvent dielectric, temperature, etc. can affect the tuning of the probe. Field strength will also vary slightly from one magnet to another, causing the same nuclei to resonate at slightly different frequencies in each magnet. For these reasons, the probe circuit must provide some means for adjusting (tuning) the sample coil's resonant frequency just prior to running an NMR experiment. This tuning is usually accomplished with variable capacitors.

In a conventional NMR probe circuit individual circuit components are soldered directly together, and hence are arranged in a three-dimensional free-form configuration. The free-form configuration has been considered to be advantageous because it generally minimizes inductance, stray capacitance and parasitic loss while maintaining the capacity for handling high voltages. While such a configuration can thus result in high performance, it does so at the cost of long design cycles (e.g., by prototyping), poor reproducibility, and expensive and time-consuming repair. Additionally, coupling between tightly packed circuits can lead to additional performance and design issues. These circuits must be carefully tuned and adjusted to operate properly.

In some NMR spectrometers, components of the probe (such as sample coils, circuit components, and/or preamplifiers) are cryogenically cooled (typically down to 20 K) via thermal conduction to a heat exchanger containing a cryogenic fluid such as liquid nitrogen or liquid/gaseous helium. The NMR sample, on the other hand, may be held at room temperature or other non-cryogenic temperature. Cryogenic probes reduce thermal noise by reducing the electrical resistance of the sample coils and thus may operate at high Q factors. NMR probe circuits having the conventional free-form architecture typically employ chip capacitors, which are prone to structural failure (and thus operational failure) at cryogenic temperatures.

In view of the foregoing, there is an ongoing need for NMR probe circuits that address the problems mentioned above.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

According to one implementation, a nuclear magnetic resonance (NMR) probe circuit assembly includes a ground plane, a dielectric substrate separated from the ground plane by an air gap, a plurality of conductive traces disposed on a surface of the dielectric substrate opposite to the air gap, a variable capacitor and a capacitor adjusting device. The conductive traces include a stationary capacitor electrode. A movable capacitor electrode is interposed between the ground plane and the dielectric substrate, in movable contact with the ground plane and the dielectric substrate, and movable in variable overlapping relation with the stationary capacitor electrode. The movable capacitor electrode, the dielectric substrate, and the stationary capacitor electrode form the second variable capacitor, which may be configured for tuning the NMR probe circuit assembly to a resonance frequency. The capacitor adjusting device is configured for moving the movable capacitor electrode relative to the stationary capacitor electrode in response to actuation.

In some implementations, the variable capacitor may be tunable to a resonance frequency of a single high-frequency nucleus such as, for example, a proton or a $^{19}$F nucleus. In other implementations, the variable capacitor may be tunable over a frequency range that includes a resonance frequency of a proton and a resonance frequency of a $^{19}$F nucleus.

In other implementations, the variable capacitor may be tunable over a frequency range that includes respective resonance frequencies of at least two different low-frequency nuclei such as, for example, a $^{13}$C nucleus, a $^{15}$N nucleus, or a $^{31}$P nucleus.

In some implementations, the capacitor adjusting device may include a linear guide, a carriage movable in the linear guide and communicating with a corresponding movable capacitor electrode, and a user-actuated rotatable element. The rotatable element may be coupled to the carriage and/or linear guide such that rotation of the rotatable element causes movement of the carriage and thus movement of the movable capacitor electrode. In some implementations, the linear guide and the carriage are interposed between the ground plane and the dielectric substrate. In some implementations, the linear guide is mounted on the ground plane.

In some implementations, the NMR probe circuit assembly includes a radio-frequency (RF) port mounted in electromagnetic isolation from the ground plane and configured for coupling with an RF transmission line. The RF port may extend through a bore of the ground plane, through the air gap, and into contact with the dielectric substrate at a location where the RF port is capacitively coupled to one of the conductive traces.

In some implementations, the conductive traces are attached to the dielectric substrate.

In some implementations, the NMR probe circuit assembly includes a circuit board disposed on the dielectric substrate. The conductive traces may be attached to the circuit board and in contact with the dielectric substrate. In some implementations, the NMR probe circuit assembly further includes an inductor mounted on a surface of the circuit board opposite to the conductive traces and communicating with at least two of the conductive traces.

According to another implementation, the variable capacitor is part of a first probe channel of the NMR probe circuit assembly configured for resonantly coupling with a high-frequency nucleus. The NMR probe circuit assembly may further include a second probe channel configured for resonantly coupling with a low-frequency nucleus.

In some implementations, the second probe channel may include a second movable capacitor electrode interposed between the ground plane and the dielectric substrate, in movable contact with the ground plane and the dielectric substrate, and movable in variable overlapping relation with a second stationary capacitor electrode of the plurality of conductive traces. The second movable capacitor electrode, the dielectric substrate, and the second stationary capacitor electrode form a second variable capacitor configured for tuning the second probe channel to a resonance frequency of the low-frequency nucleus. The NMR probe circuit assembly may further include a second capacitor adjusting device configured for moving the second movable capacitor electrode relative to the second stationary capacitor electrode in response to actuation.

In some implementations, the first probe channel may include a first radio-frequency (RF) port configured for coupling with a first RF transmission line, and the second probe channel may include a second RF port configured for coupling with a second RF transmission line.

In some implementations, the variable capacitor of the first probe channel is tunable over a frequency range that includes a resonance frequency of a proton and a resonance frequency of a $^{19}$F nucleus. In some implementations, the variable capacitor of the second probe channel is tunable to a resonance frequency of deuterium.

According to another implementation, the ground plane, the dielectric substrate, the plurality of conductive traces, the first variable capacitor, the first capacitor adjusting device, the second variable capacitor, and the second capacitor adjusting device are part of a first probe circuit of the NMR probe circuit assembly. The NMR probe circuit assembly may further include a second probe circuit physically separate from the first probe circuit. The first probe circuit is configured for signal communication with a first sample coil, and the second probe circuit is configured for signal communication with a second sample coil and is tunable to a resonance frequency of a low-frequency nucleus of a different type than the second probe channel of the first probe circuit.

In some implementations, the second probe circuit may include a second ground plane, a second dielectric substrate separated from the second ground plane by a second air gap, a second plurality of conductive traces disposed on a surface of the second dielectric substrate opposite to the second air gap, and a third variable capacitor. The second plurality of conductive traces includes a third stationary capacitor electrode. A third movable capacitor electrode is interposed between the second ground plane and the second dielectric substrate, in movable contact with the second ground plane and the second dielectric substrate, and movable in variable overlapping relation with the third stationary capacitor electrode. The third movable capacitor electrode, the second dielectric substrate, and the third stationary capacitor electrode form the third variable capacitor, which may be configured for tuning the second probe circuit to a resonance frequency of the nucleus of a different type than the second probe channel of the first probe circuit. The NMR probe circuit assembly may further include a third capacitor adjusting device configured for moving the third movable capacitor electrode relative to the third stationary capacitor electrode in response to actuation.

In some implementations, the first probe channel may be tunable to a resonance frequency of a proton, a resonance frequency of a $^{19}$F nucleus, or over a frequency range that includes the resonance frequency of the proton and the resonance frequency of the $^{19}$F nucleus. The second probe channel may be tunable to a resonance frequency of deuterium. The second probe circuit may be tunable to a resonance frequency of a low-frequency nucleus other than deuterium, or over a frequency range that includes the resonance frequencies of at least two different low-frequency nuclei other than deuterium.

According to another implementation, an NMR probe circuit assembly includes a first probe circuit and a second probe circuit physically separate from the first probe circuit. The first probe circuit includes a ground plane, a dielectric substrate, a plurality of electrically conductive traces, a variable capacitor and a capacitor adjusting device. The first probe circuit is configured for signal communication with a first sample coil and is tunable to a resonance frequency of a nucleus of a first type, and the second probe circuit is configured for signal communication with a second sample coil and is tunable to a resonance frequency of a nucleus of a second type.

In some implementations, the second probe circuit may include a second ground plane, a second dielectric substrate separated from the second ground plane by a second air gap, a second plurality of electrically conductive traces disposed on a surface of the second dielectric substrate opposite to the second air gap, and a second variable capacitor. The second plurality of conductive traces includes a second stationary capacitor electrode. A second movable capacitor electrode is interposed between the second ground plane and the second dielectric substrate, in movable contact with the second ground plane and the second dielectric substrate, and movable in variable overlapping relation with the second stationary capacitor electrode. The second movable capacitor electrode, the second dielectric substrate, and the second stationary capacitor electrode form the second variable capacitor, which may be configured for tuning the second probe circuit to a resonance frequency of the nucleus of the second type. The NMR probe circuit assembly may further include a second capacitor adjusting device configured for moving the second movable capacitor electrode relative to the second stationary capacitor electrode in response to actuation.

In some implementations, the first probe circuit may be tunable to a resonance frequency of a proton, a resonance frequency of a $^{19}F$ nucleus, or over a frequency range that includes the resonance frequency of the proton and the resonance frequency of the $^{19}F$ nucleus. The second probe circuit may be tunable to a resonance frequency of a low-frequency nucleus, or over a frequency range that includes the resonance frequencies of at least two different low-frequency nuclei.

In some implementations, the first probe circuit includes a first probe channel configured for resonantly coupling with a high-frequency nucleus, and a second probe channel configured for resonantly coupling with a low-frequency nucleus. In some implementations, the first probe channel may be tunable to a resonance frequency of a proton, a resonance frequency of a $^{19}F$ nucleus, or over a frequency range that includes the resonance frequency of the proton and the resonance frequency of the $^{19}F$ nucleus. The second probe channel may be tunable to a resonance frequency of deuterium. The second probe circuit may be tunable to a resonance frequency of a low-frequency nucleus other than deuterium, or over a frequency range that includes the resonance frequencies of at least two different low-frequency nuclei other than deuterium.

In some implementations, the NMR probe circuit assembly (or a particular probe circuit of the NMR probe circuit assembly) may include a variable capacitor configured for impedance matching between a sample coil and a transmission line communicating with the NMR probe circuit assembly (or probe circuit of the NMR probe circuit assembly). The variable capacitor may include a stationary capacitor electrode and a movable capacitor electrode. The NMR probe circuit assembly may include a capacitor adjusting device configured for moving the movable capacitor electrode relative to the stationary capacitor electrode in response to actuation.

According to another implementation, an NMR probe includes a sample coil and an NMR probe circuit assembly in signal communication with the sample coil. The NMR probe circuit assembly may be provided in accordance with any of the implementations summarized above or described herein.

According to another implementation, an NMR spectrometer includes a magnet, an NMR probe disposed in a bore of the magnet, and a control/acquisition system. The NMR probe includes a sample coil and an NMR probe circuit assembly in signal communication with the sample coil and with the control/acquisition system. The NMR probe circuit assembly may be provided in accordance with any of the implementations summarized above or described herein. The control/acquisition system may include, for example, radio-frequency (RF) transmitting circuitry, RF receiving circuitry, and circuitry for processing or analyzing NMR response signals received by the sample coil.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

As used herein, the term "sample coil" refers to a nuclear magnetic resonance (NMR) sample coil, i.e., a sample coil configured for transferring RF energy to and/or from a sample in an NMR spectrometer. The design and operation of various types of sample coils are known to persons skilled in the art.

As used herein, the term "nucleus" or "nuclei" refers to NMR-active nuclei. NMR-active nuclei are those possessing the quantum property of spin and behave as magnetic dipoles and thus are responsive to RF irradiation in a manner useful for NMR spectrometry. Terms such as "high resonance frequency nucleus," "high-frequency nucleus" and "HF nucleus" refer to nuclei having a higher resonance frequency in a magnetic field of a given field strength, relative to other types of nuclei in the same magnetic field. Typical examples of high-frequency nuclei are tritium ($^{3}H$), hydrogen (or proton, $^{1}H$), and the fluorine isotope $^{19}F$. Terms such as "low resonance frequency nucleus," "low-frequency nucleus" and "LF nucleus" generally refer to nuclei having a lower resonance frequency than $^{19}F$ in a magnetic field of the same given field strength. Many different types of nuclei may be characterized as low-frequency nuclei as appreciated by persons skilled in the art, a few common examples being the phosphorous isotope $^{31}P$, the carbon isotope $^{13}C$, deuterium ($^{2}H$), and the nitrogen isotope $^{15}N$.

As used herein, the term "resonance frequency" (or "Larmor frequency") refers to the resonance frequency of a nucleus that may be electromagnetically coupled with a sample coil.

Figure 1:
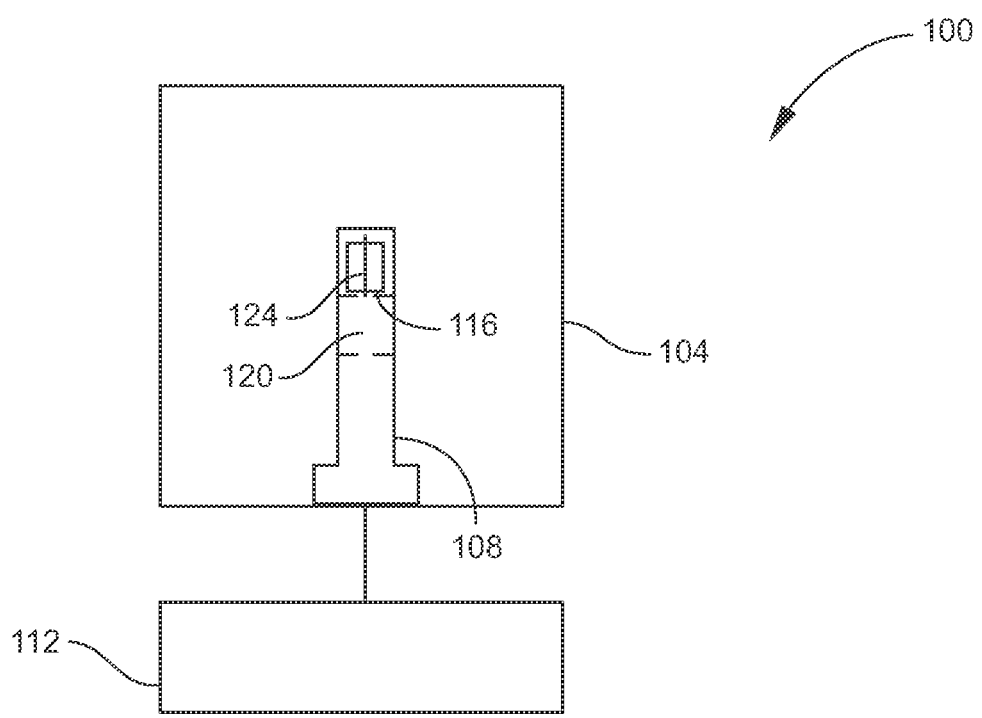
FIG. 1 is a schematic view of an example of a nuclear magnetic resonance (NMR) spectrometer.

FIG. 1 is a schematic view of an example of a nuclear magnetic resonance (NMR) spectrometer 100. The NMR spectrometer 100 generally includes a (typically superconducting) magnet 104 for applying the static magnetic $B_0$ field, an NMR probe 108 disposed in a bore of the magnet 104, and a control/acquisition system 112 in signal communication with the magnet 104 and the NMR probe 108. The NMR probe 108 may be operated at room temperature or variable temperature, or the circuitry of the NMR probe 108 may be cryogenically cooled (e.g., down to 20 K) as appreciated by persons skilled in the art. For cryogenic operation the NMR probe 108 is enclosed in a vacuum. The NMR probe 108 includes one or more radio frequency (RF) sample coils 116 and an NMR probe circuit assembly 120 containing one or more probe circuits in signal communication with the respective sample coils 116. When more than one sample coil 116 is provided, the sample coils 116 are typically arranged coaxially (e.g., an inner coil and an outer coil). In operation, a sample container 124 containing the sample to be irradiated is inserted in the NMR probe 108 such that the sample container 124 is coaxially surrounded by the sample coil(s) 116. The sample container 124 may, for example, be a closed tube or a flow cell. The probe circuit assembly 120 typically includes electrical components such as capacitors, inductors, and other components utilized for frequency tuning and for impedance matching between a given sample coil 116 and transmission line communicating with the probe circuit assembly 120. The probe circuit assembly 120 is also utilized for transmitting RF excitation signals (periodic magnetic $B_1$ fields) to the sample coil(s) 116 and receiving RF measurement signals (NMR response signals) from the sample coil(s) 116. The control/acquisition system 112 includes electronics in signal communication with the probe circuit assembly 120 for transmitting the RF excitation signals to the probe circuit assembly 120, receiving the resulting RF measurement signals from the probe circuit assembly 120, conditioning and processing the RF measurement signals, and producing frequency-domain NMR spectra therefrom.

As appreciated by persons skilled in the art, the control/acquisition system 112 typically includes RF transmission circuitry, RF receiving circuitry, and a transmit/receive isolator that electromagnetically isolates the RF receiving circuitry from the RF transmission circuitry to protect the sensitive detection components of the RF receiving circuitry. The RF transmission circuitry may include components such as, for example, an RF source (which may include an RF generator, frequency synthesizer, and/or pulse programmer); a modulator for gating, attenuating, and/or shaping the RF signal; and an amplifier for setting the $B_1$ field strength. The RF receiving circuitry may include components such as, for example, an amplifier, an RF receiver, a phase detector with quadrature architecture, and a Fourier Transform analyzer for converting the time-domain RF measurement signals to frequency-domain signals. The control/acquisition system 112 may further include an electronic processor-based controller for controlling the various functions of the NMR spectrometer 100, with input and output interfaces for user input, display or print-out of NMR spectra, etc. The controller may include memory containing various types of components, such as instructions for programming RF excitation pulse sequences, NMR measurement data analysis software, databases of known NMR spectral information, and the like for assisting in interpreting the NMR spectra. All or part of the controller and associated modules and peripherals may be embodied in a computer (which may for example be provided in a workstation or console).

Typically, the RF excitation signals are applied in pulses and thus a given sample coil 116 may be utilized for both transmission and reception of RF signals. Moreover, a given probe circuit of the probe circuit assembly 120 (and its corresponding sample coil 116) may be multiply resonant, and may provide multiple channels for this purpose. A multiply resonant probe circuit may be configured for resonantly coupling with more than one type of NMR-active nucleus simultaneously, or may be adjustable over a range of resonance frequencies to couple with different types of selected NMR-active nuclei. However, the probe circuit assembly 120 may include more than one distinct probe circuit—and the NMR probe 108 may include more than one corresponding sample coil 116—to facilitate implementation of different channels, as in the examples described below.

Figure 2:
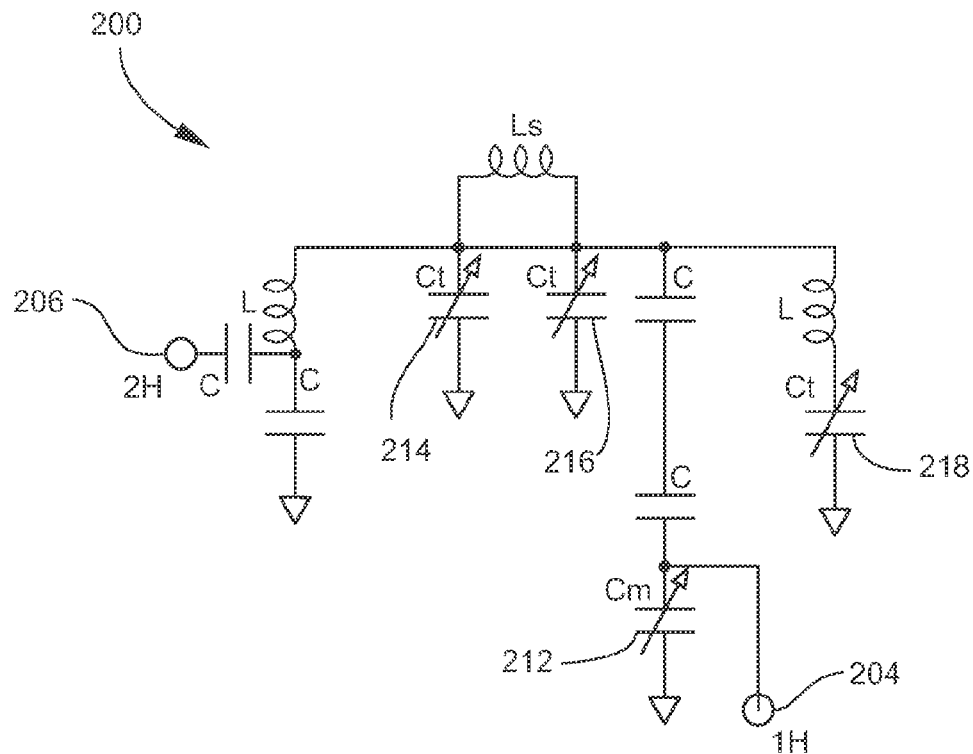
FIG. 2 is a schematic view of an example of a multiply resonant probe circuit.

FIG. 2 is a schematic view of an example of a multiply resonant tunable probe circuit 200, in this case a doubly resonant probe circuit. An inductor $L_S$ represents a sample coil of an NMR probe. The tunable probe circuit 200 includes a first RF input port 204 associated with a first channel and a second RF input port 206 associated with a second channel. The input ports 204, 206 may be connected to respective RF transmission lines (not shown) such as, for example, 50-Ω coaxial cables. As an example, the first channel may be tuned to resonantly couple with a hydrogen ($^1$H) nucleus and the second channel may be tuned to resonantly couple with a deuterium ($^2$H) nucleus. This type of configuration is often termed a proton-lock or HD circuit. For example, at a given magnetic field strength the resonance frequencies of a proton and deuterium may be 500 MHz and 76 MHz, respectively. However, the first channel may be tunable or switchable to another high-resonance frequency nucleus such as the fluorine isotope $^{19}$F, and the second channel may be tunable or switchable to another low-resonance frequency nucleus such as the carbon isotope $^{13}$C. The probe circuit 200 may include a combination of variable capacitors (depicted with oblique arrows), fixed capacitors, and inductors (in addition to the sample coil $L_S$). Variable capacitors designated $C_m$ are utilized for impedance matching and variable capacitors designated $C_t$ are utilized for frequency tuning. Thus, the first channel may be generally described as a high-frequency (HF) channel, and the second channel may be generally described as a low-frequency (LF) channel.

In the example specifically illustrated in FIG. 2, a variable capacitor 212 is utilized to match the first (proton) channel, i.e., perform impedance matching between the sample coil and the transmission line communicating with the probe circuit 200 (at the first RF input port 204). Variable capacitors 214, 216 coupled in parallel with the sample coil are utilized to tune the first channel, and a variable capacitor 218 is utilized to tune the second (lock) channel. In this specific example, the impedance matching of the second channel is fixed, but alternatively may be adjustable by providing an appropriate variable capacitor (not shown). Inductors $L_1$ and $L_2$ may function to prevent the RF signals of the respective first channel and second channel from leaking to ground, and electrically isolate the two channels from each other. Fixed capacitors C may serve various purposes such as cooperating with the variable capacitors $C_m$, or $C_t$ for matching or tuning, matching the second channel, or cooperating with the inductors $L_1$ and $L_2$ for isolation.

Figure 3:
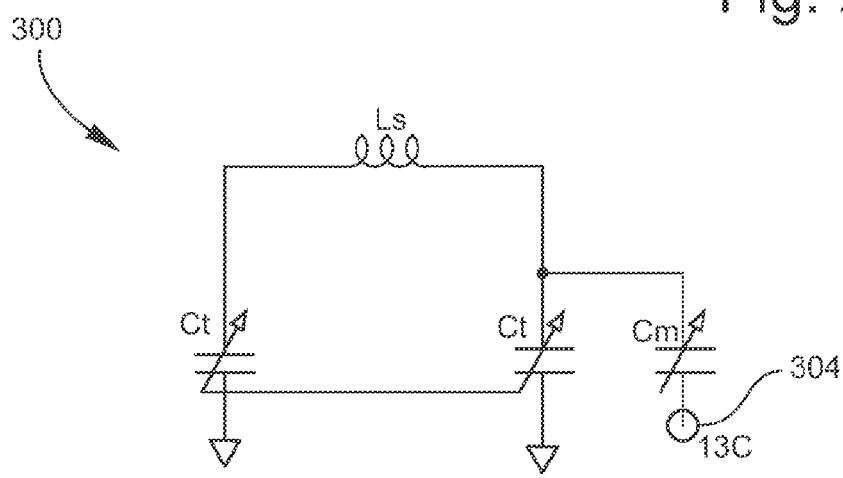
FIG. 3 is a schematic view of an example of a broadband probe circuit.

FIG. 3 is a schematic view of another example of a multiply resonant tunable probe circuit 300, in this case a broadband probe circuit. The tunable probe circuit 300 includes a sample coil $L_S$ of an NMR probe, an RF input port 304 (typically connected to an RF transmission line such as a 50-Ω coaxial cable), a variable capacitor $C_m$ utilized for impedance matching, and variable capacitors $C_t$ utilized for frequency tuning. As an example, the variable capacitors $C_t$ enable the probe circuit 300 to be selectively tuned to any one of a plurality of available resonance frequencies that are lower than the higher resonance frequencies associated with $^1$H and $^{19}$F nuclei. Examples of commonly studied NMR-active nuclei having relatively lower resonant frequencies include, but are not limited to, the carbon isotope $^{13}$C, the nitrogen isotope $^{15}$N, and the phosphorous isotope $^{13}$P. Many more types of NMR-active nuclei exist as appreciated by persons skilled in the art. In one implementation the probe circuit 300 is tunable between $^{13}$C and $^{15}$N resonance frequencies. In another implementation, the probe circuit 300 may additionally be configured to be switchable to a $^{13}$P resonance frequency. In other implementations, the probe circuit 300 may be configured to be tunable over different and/or broader ranges of frequencies and/or switchable to other frequencies.

As an example, the tunable probe circuits 200, 300 illustrated in FIGS. 2 and 3 may both be provided in the probe circuit assembly 120 illustrated in FIG. 1 and communicate with respective sample coils 116. Moreover, more than two multiply resonant and/or broadband probe circuits may be provided. In addition, a given multiply resonant probe circuit may be doubly resonant as in the example of FIG. 2, or may be triply resonant or more generally n-resonant as appreciated by persons skilled in the art. Alternatively, a given probe circuit may be a single-channel circuit configured for resonantly coupling with a single type of NMR-active nucleus. Any combination of probe circuits may be utilized to form a probe circuit assembly 120 characterized by having multiple separate, independently matched and tuned channels. Using conventional notation, the channels of the probe circuit assembly 120 may include one or more of the following channels: H, F, D, X, Y, . . . n, where H designates a high-frequency channel for exciting a $^1$H nucleus (a proton), F designates a lower-frequency (yet still relatively high-frequency) channel for exciting a $^{19}$F nucleus, D designates a low-frequency channel for exciting a $^2$H nucleus (deuterium lock solvent), and X, Y, . . . n designate one or more low-frequency channels for exciting other types of nuclei having low resonance frequencies (e.g., $^{13}$C, $^{15}$N, $^{13}$P, etc.).

An example of an NMR probe and associated probe circuit assembly structured according to the present teachings will now be described with reference to FIGS. 4-10.

Figure 4:
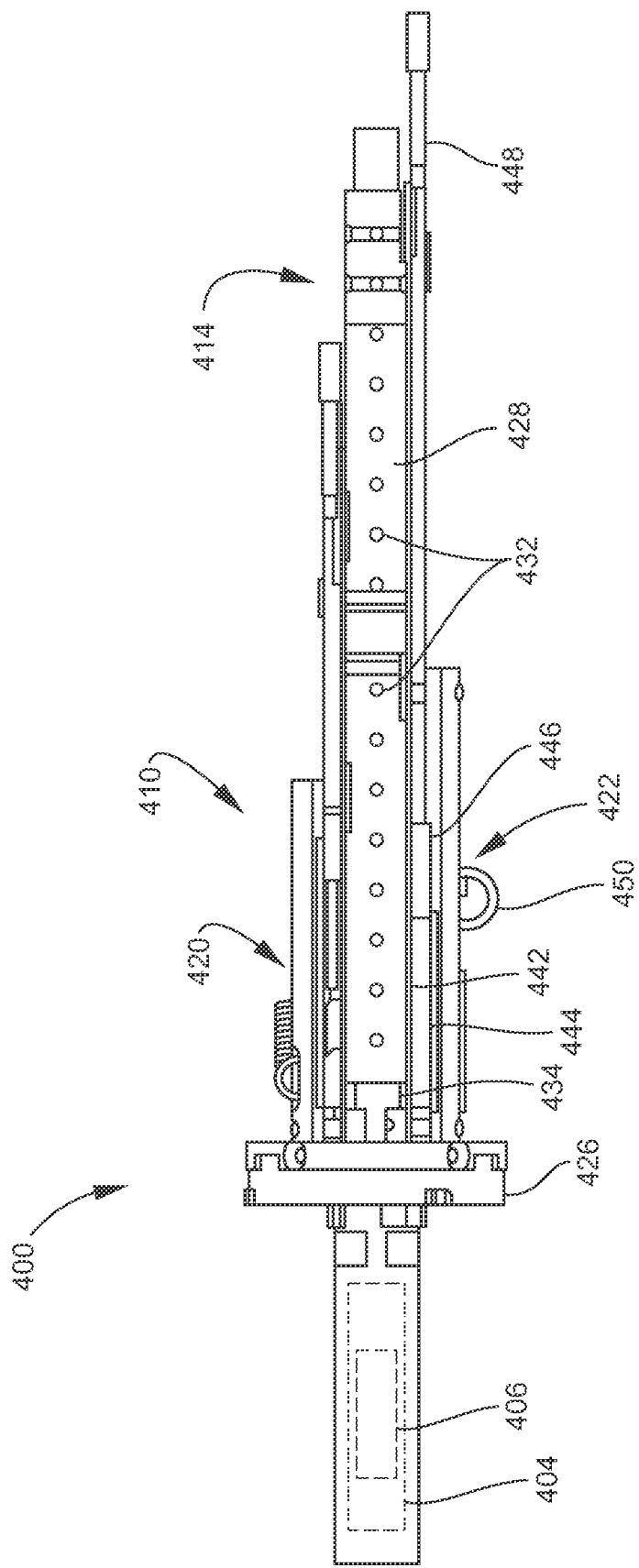
FIG. 4 is a view of an example of an NMR probe.

FIG. 4 is a view of an example of an NMR probe 400. The NMR probe 400 includes one or more sample coils 404, 406 and an NMR probe circuit assembly 410, all of which components may be mounted to (supported by) a frame or chassis 414. The NMR probe 400 may be configured for room-temperature, variable-temperature, or cryogenic operation. For simplicity, components of a heat exchanging system associated with cryogenic operation are not specifically shown. The probe circuit assembly 410 may include one or more physically separate tunable probe circuits. In the present example, the probe circuit assembly 410 includes a first tunable probe circuit 420 and a second tunable probe circuit 422. In the present example, the first probe circuit 420 is an HD probe circuit (e.g., the tunable probe circuit 200 schematically illustrated in FIG. 2) and the second probe circuit 422 is a broadband probe circuit (e.g., the tunable probe circuit 300 schematically illustrated in FIG. 3). The chassis 414 may include a transversely-oriented structural member 426 on which the sample coils 404, 406 are directly or indirectly supported, and which physically separates the sample coils 404, 406 from the probe circuit assembly 410. The chassis 414 may also include an axially-oriented structural member 428 on which the probe circuits 420, 422 are mounted. As an example, the axially-oriented structural member 428 may include mounting bores 432. Mounting bores (not shown) of the probe circuits 420, 422 may be aligned with selected mounting bores 432 of the axially-oriented structural member 428, and fasteners (e.g., screws or bolts, not shown) inserted into the mounting bores 432 to secure the probe circuits 420, 422 to the axially-oriented structural member 428. It thus can be seen that the NMR probe 400 has a modular design in which the sample coils 404, 406 and individual probe circuits 420, 422 may be quickly and easily mounted, demounted, and swapped out as needed. In some implementations the axially-oriented structural member 428 may serve as a heat sink, with the fasteners serving as thermal contacts through which heat from the probe circuits 420, 422 is transferred to the axially-oriented structural member 428. The sample coils 404, 406 may coaxially surround a central tube 434 in which the sample of interest is loaded. The central tube 434 may also extend through the axially-oriented structural member 428.

FIGS. 5-10 illustrate an example of the first tunable probe circuit 420 according to one implementation.

Figure 5:
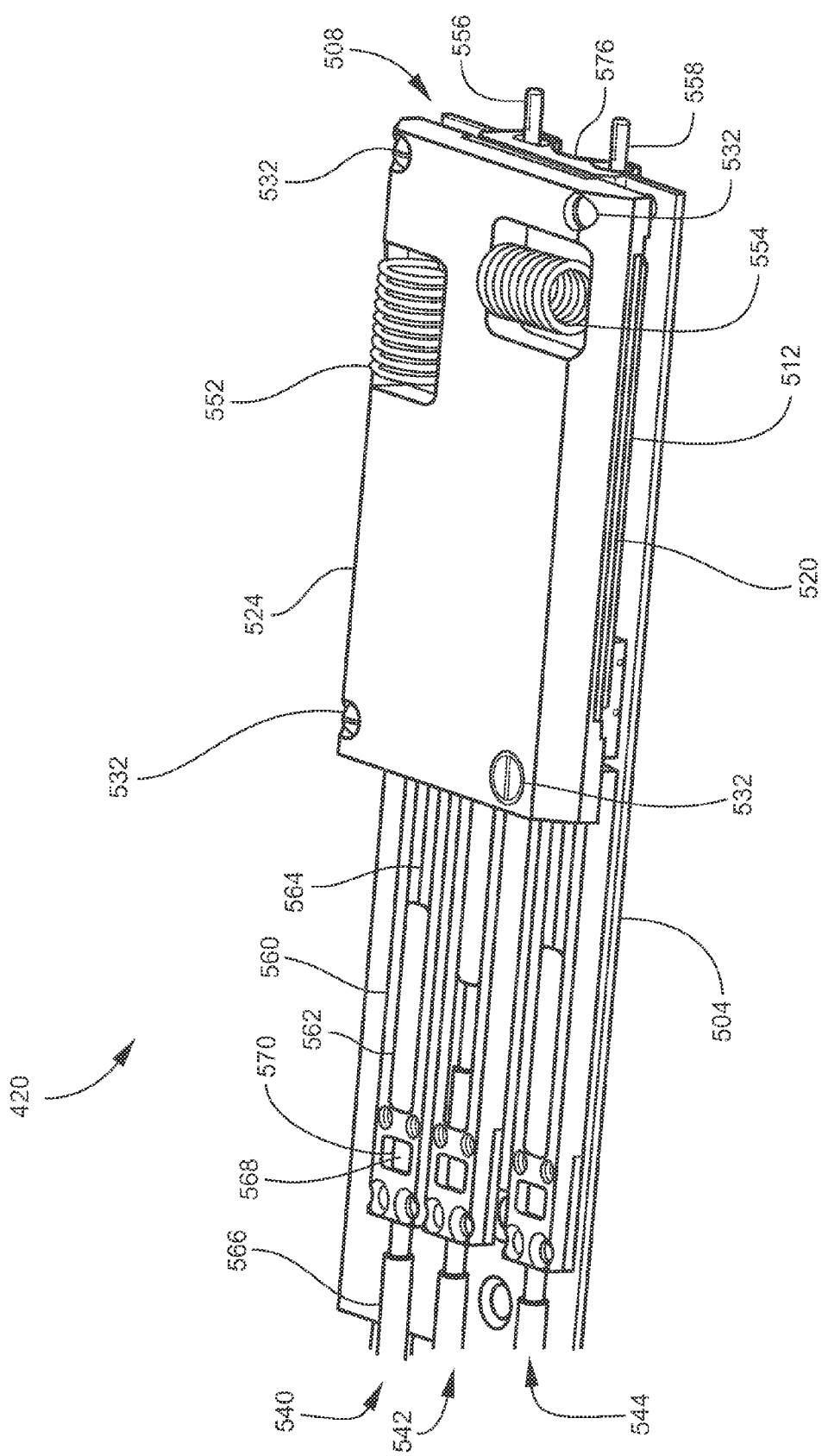
FIG. 5 is a perspective view of an example of a tunable probe circuit that may be included with the NMR probe illustrated in FIG. 4.
Figure 6:
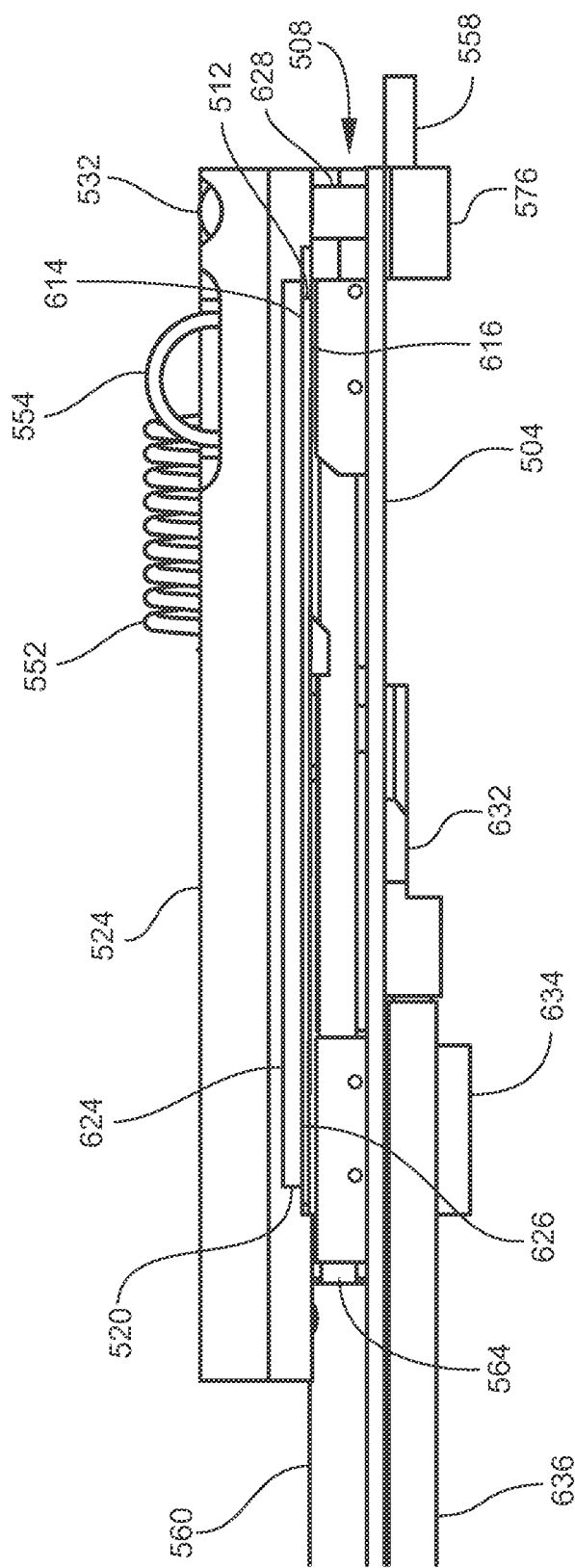
FIG. 6 is a side view of the tunable probe circuit illustrated in FIG. 5.

FIGS. 5 and 6 are perspective and side views of the first tunable probe circuit 420 in assembled form. The first probe circuit 420 has a suspended substrate architecture in which a ground plane 504 is electrically isolated from certain circuit components by an air space or air gap 508. The ground plane 504 may be a layer or plate of an electrically conductive material or a substrate of any composition that is plated with an electrically conductive material. In one non-limiting example, the ground plane 504 is a plate of oxygen-free high-conductivity copper (OFHC) plated with gold. The ground plane 504 may support capacitor adjusting devices 540, 542, 544 and various circuit components as described below. A dielectric substrate 512 (e.g., a layer or plate) is suspended above and hence separated from the ground plane 504. The dielectric substrate 512 includes a planar first surface 614 and an opposing planar second surface 616. The dielectric substrate 512 may be composed of any dielectric, thermally conductive material suitable for use in an NMR probe circuit. Non-limiting examples include sapphire ($Al_2O_3$), diamond, aluminum nitride (AlN), thermally conductive ceramics such as alumina (aluminum oxide, or $Al_2O_3$), beryllia (beryllium oxide, or BeO) or the like, and dielectric materials typically utilized as circuit board substrates. Single-crystal sapphire has been found to be particularly advantageous for its good thermal conductivity at cryogenic temperatures, high dielectric constant, low dielectric loss, and facility for realizing high Q factors in the probe circuit 420. As will be apparent from the description below, the dielectric substrate 512 serves as a common dielectric substrate for several fixed and variable capacitors.

In some implementations, a circuit board 520 is disposed on the dielectric substrate 512. Circuit components may be included on one or both sides of the circuit board 520, as described below. The circuit board 520 includes a planar first surface 624 and an opposing planar second surface 626. The circuit board 520 may be composed of any dielectric material having a high dielectric constant and low dielectric loss suitable for use in a NMR probe circuit. One non-limiting example of the circuit board 520 is composed of a glass microfiber-reinforced polyetrafluoroethylene (PTFE) composite such as the RT/duroid® 5880 laminate commercially available from Rogers Corporation, Chandler, Ariz. The circuit board 520 may be considered as a second dielectric substrate relative to the first dielectric substrate 512.

An outer, electrically insulating structural layer (plate or block) 524 may be disposed on the circuit board 520 whereby the circuit board 520 is interposed between the outer structural layer 524 and the dielectric substrate 512. The outer structural layer 524 may, for example, be composed of any dielectric material having a high dielectric constant and low dielectric loss suitable for use in a NMR probe circuit. One non-limiting example of the outer structural layer 524 is composed of translucent cross-linked polystyrene such as a Rexolite® plastic commercially available from C-Lec Plastics, Inc., Philadelphia, Pa. The outer structural layer 524 may include recesses to allow the outer structural layer 524 to encapsulate the lateral edges of the circuit board 520 and the dielectric substrate 512. The dielectric substrate 512 and the circuit board 520 may be affixed to the outer structural layer 524 by any means (e.g., fasteners, adhesion, or bonding). The outer structural layer 524 may be secured to one or more spacers 628 interposed between the ground plane 504 and the outer structural layer 524. The spacers 628 may be provided as posts extending upward from the ground plane 504. For example, holes of the outer structural layer 524 may be aligned with the spacers 628, and threaded fasteners 532 inserted through the holes and into complementarily threaded bores of the spacers 628. By such a configuration, the circuit board 520 and dielectric substrate 512 are sandwiched between the ground plane 504 and outer structural layer 524, with the air gap 508 between the ground plane 504 and the dielectric substrate 512 being set to a desired distance (in one non-limiting example, about 0.10 inch, or about 2.5 mm) by the spacers 628, i.e., the spacers 628 define a distance of the air gap 508.

Figure 7:
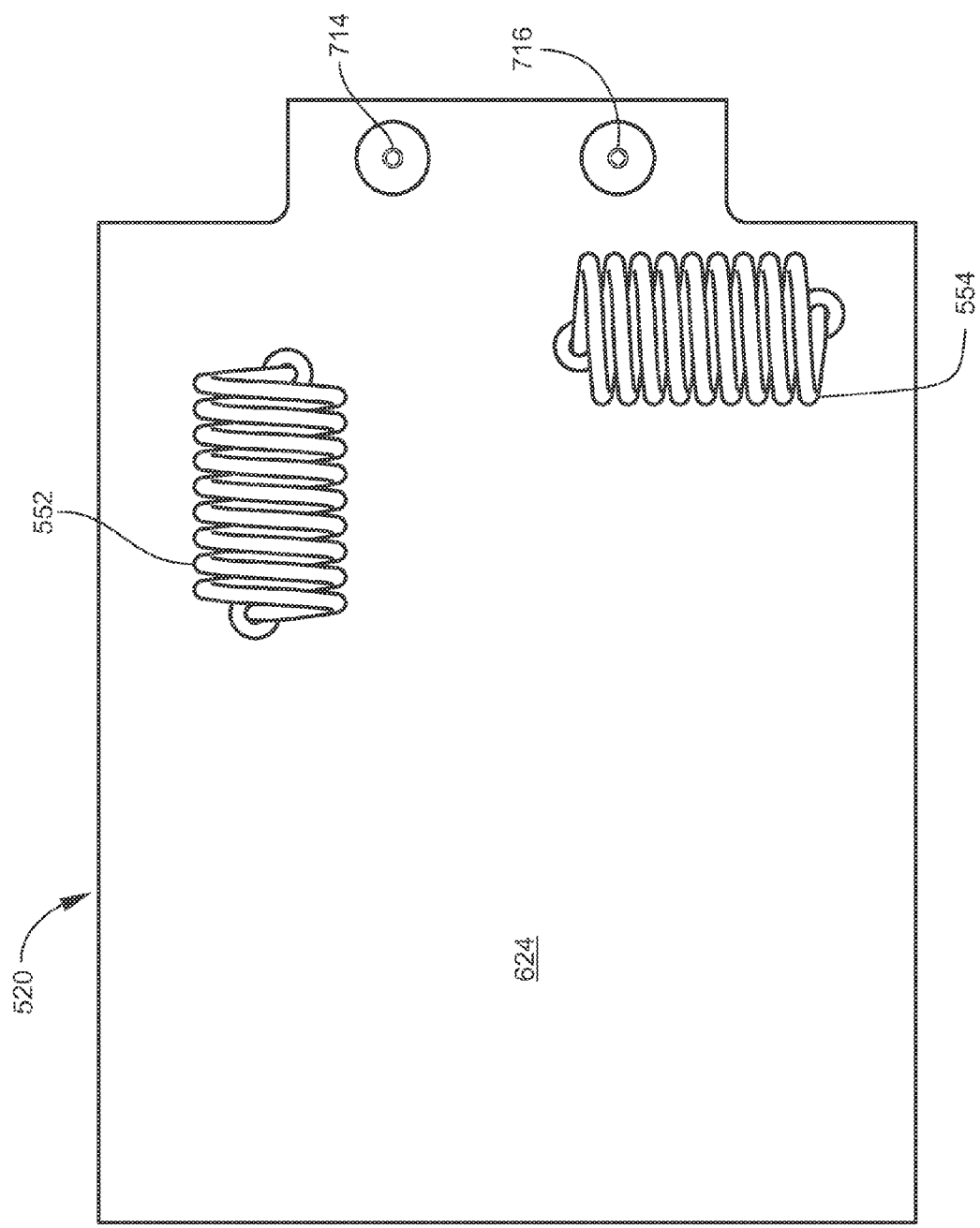
FIG. 7 is a top plan view of an example of a circuit board that may be included with the tunable probe circuit illustrated in FIGS. 5 and 6.
Figure 8:
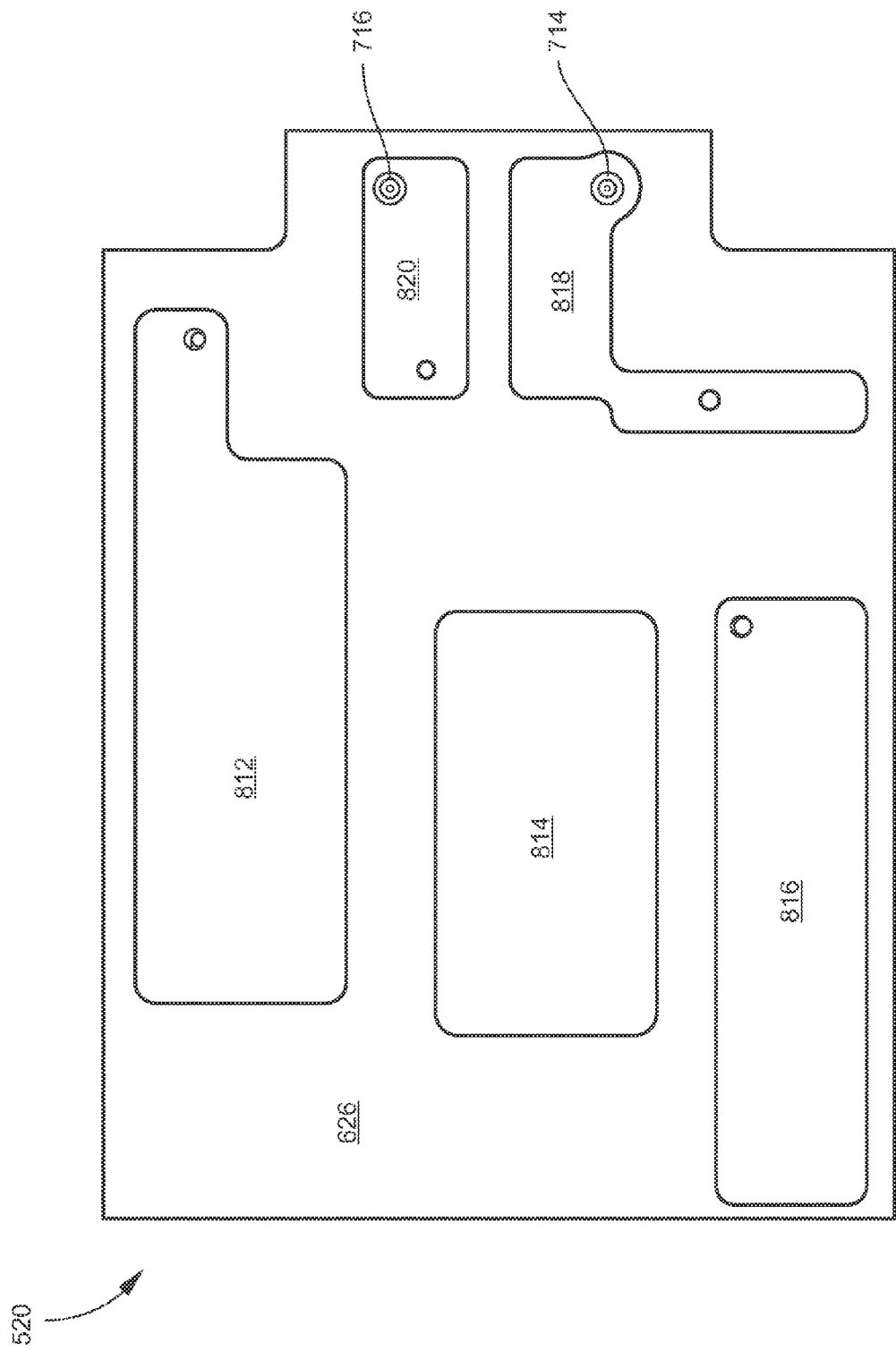
FIG. 8 is a bottom plan view of the circuit board illustrated in FIG. 7.

FIGS. 7 and 8 are respective top and bottom plan views of an example of the circuit board 520 according to one implementation. Two inductors 552, 554 are mounted at the first surface 624. In the present example, the two inductors 552, 554 correspond respectively to the inductors $L_1$ and $L_2$ illustrated in FIG. 2, described above. A plurality of electrically conductive traces (or planar electrical conductors) 812-820 is formed on the second surface 626. The electrically conductive traces 812-820 may be formed by any suitable technique such as, for example, forming a metallization layer on the second surface 626 followed by a patterning process. The conductive traces 812-820 may also be referred to as a patterned conductive layer. Any suitable electrically conductive material may be utilized, a few non-limiting examples being copper and high-temperature superconducting (HTS) materials such as various cuprates, iron-based compounds and other HTS materials. Some of the conductive traces 812-820 serve as the "upper" capacitor electrodes of fixed capacitors and as the stationary ("upper") capacitor electrodes of variable capacitors. Other conductive traces 812-820 may serve as electrical interconnects between the inductors 552, 554 and the capacitors or between RF output terminals (a first terminal 556 and a second terminal 558) of the probe circuit 420 and an associated sample coil 404 or 406. In this example, the inductors 552 and 554 respectively communicate with selected conductive traces 816, 818 and 812, 820 through inductor leads inserted through vias of the circuit board 520, with solder applied to complete the electrical connections. When the first probe circuit 420 is assembled (FIG. 6), the second surface 626 of the circuit board 520 faces the first surface 614 of the dielectric substrate 512 and thus the conductive traces 812-820 are disposed on the first surface 614 of the dielectric substrate 512.

In an alternative implementation, the conductive traces 812-820 are fabricated on (or otherwise attached to) the first surface 614 of the dielectric substrate 512 by any suitable technique such as vacuum deposition followed by patterning (e.g., lithography, etching). In this case the circuit board 520 may be eliminated, or a smaller circuit board may be utilized for stably positioning the inductors 552, 554, in communication with the appropriate conductive traces 816, 818 and 812, 820. Whether fabricating the conductive traces 812-820 (patterned conductive layer) on the circuit board 520 or on the dielectric substrate 512, in either case after assembly the conductive traces 812-820 are disposed on the dielectric substrate 512, opposite to corresponding "lower" capacitor electrodes as will now be described. Moreover, in either case excellent thermal contact is made between the conductive traces 812-820 and the dielectric substrate 512.

Figure 9:
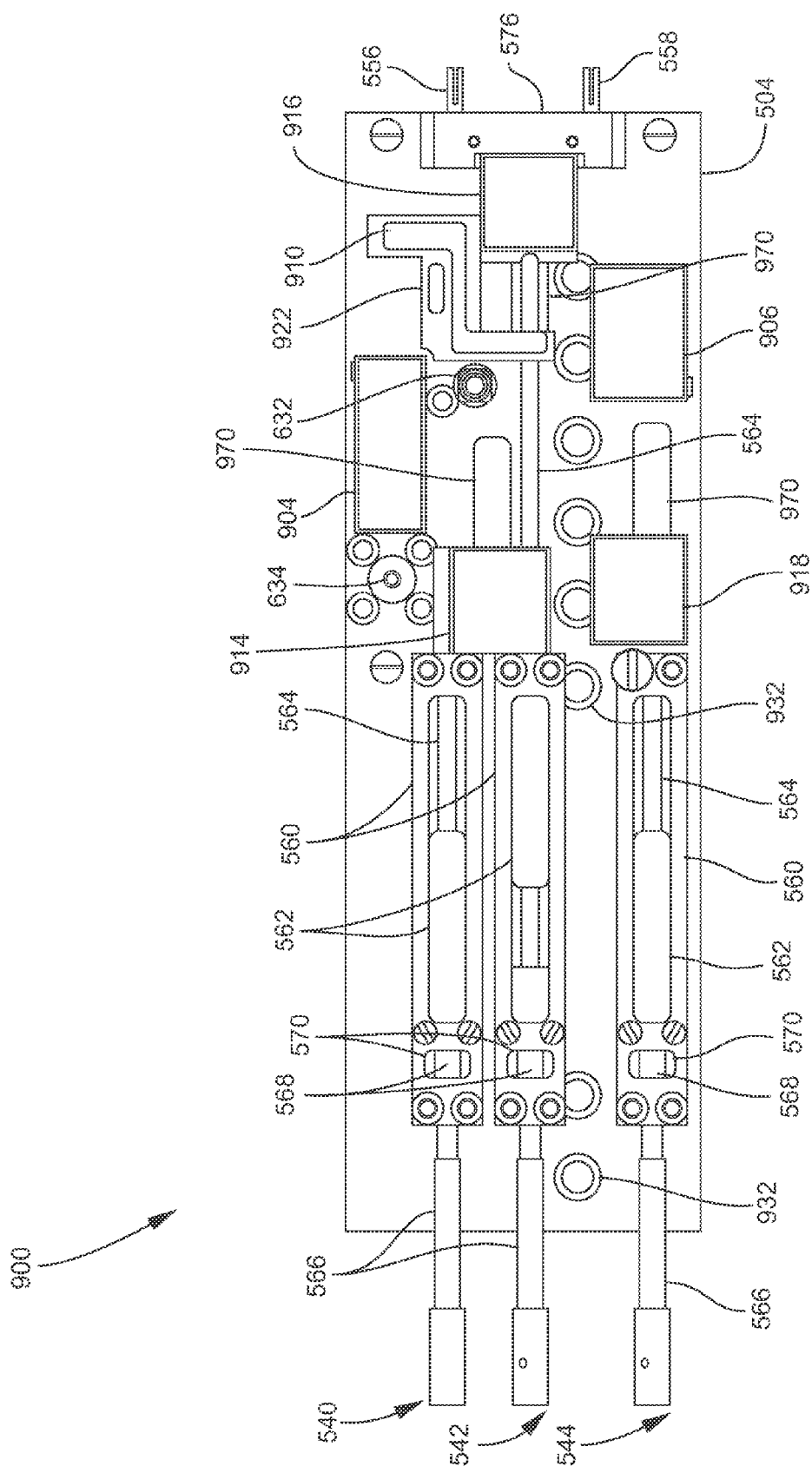
FIG. 9 is a top plan view of an example of a ground plane assembly that may be included with the tunable probe circuit illustrated in FIGS. 5 and 6.

FIG. 9 is a top plan view of a ground plane assembly 900 of the first probe circuit 420. The ground plane 504 may include mounting bores 932 which, as noted above, may be aligned with selected mounting bores 432 of the axially-oriented structural member 428 of the probe chassis 414 (FIG. 4) so that the ground plane 504 may be secured to, and thermally communicate with, the axially-oriented structural member 428 via fasteners. The ground plane assembly 900 includes one or more "lower" capacitor electrodes 904, 906 for forming fixed capacitors in a shunt configuration (communicating with the ground plane 504), one or more "lower" capacitor electrodes 910 for forming fixed capacitors in a series configuration (electrically floating), and one or more movable ("lower") capacitor electrodes 914, 916, 918 for forming variable capacitors. In the present example all of the variable capacitors are shunt capacitors. In the present example the lower capacitor electrode(s) 910 implemented as series capacitor(s) may be electrically isolated from the ground plane 504 by an intervening block 922 of dielectric material. The lower capacitor electrodes 904-918 are mounted so as to contact the second surface 616 of the dielectric substrate 512. Some or all of the lower capacitor electrodes 904-918 may, for example, have the same composition as the ground plane 504 or may be composed of other suitable electrically conductive materials. When the first probe circuit 420 is assembled, each variable or fixed capacitor is formed by a respective upper capacitor electrode (conductive trace 812-820) of the circuit board 520 (or of the dielectric substrate 512), a lower capacitor electrode 904-918 of the ground plane assembly 900, and a region of the intervening common dielectric substrate 512. The resulting fixed capacitors and variable capacitors therefore have a parallel-plate configuration. In some implementations, one or more of the capacitors may share a common upper capacitor electrode or lower capacitor electrode. In the present context, the terms "upper" and "lower" are used in a relative sense for illustrative purposes only, and not as any limitation on the orientation of the first probe circuit 420.

The capacitance C of a parallel-plate capacitor may be expressed as $C = \epsilon_r \epsilon_0 A/d$, where $\epsilon_r$ is the dielectric constant of the dielectric layer, $\epsilon_0 \approx 8.854 \times 10^{-12}$ F·m$^{-1}$ is the electrical constant, A is the area of the plates (the two capacitor electrodes), and d is the distance by which the plates are separated. Hence, in a parallel-plate variable capacitor the capacitance C may be varied by changing the area A of overlap between the plates. In the present implementation, changing the area A is accomplished by moving the movable capacitor electrode 914, 916 or 918 of a given variable capacitor relative to the corresponding stationary capacitor electrode (corresponding conductive traces 812-820). Each movable capacitor electrode 914, 916, 918 is axially translatable (e.g., slidable) along the ground plane 504 in both forward and reverse directions. The capacitor adjusting devices 540, 542 and 544 mechanically communicate with the respective movable capacitor electrodes 914, 916 and 918 so as to enable a user to manually actuate the movement, and thus the adjustment, of the variable capacitors for either impedance matching or frequency tuning.

In the present implementation, each capacitor adjusting device 540, 542, 544 includes a linear guide 560 that supports the linear movement of a carriage 562. A linkage 564 (e.g., a shaft) interconnects the carriage 562 with the corresponding movable capacitor electrode 914, 916 or 918. This linkage 564 may be either a conductive or insulating material, depending on details of the circuit design. A rotatable element 566 configured for manipulation by the user is connected to the carriage 562 and includes threads mated to complementary threads of a bore of the carriage 562. Accordingly, rotation of the rotatable element 566 is converted to linear translation of the carriage 562, and thus of the linkage 564 and movable capacitor electrode 914, 916 or 918, in either the forward or reverse direction depending on the direction of rotation. The rotatable element 566 may include a large-diameter portion 568 that is captured in a section 570 of the linear guide 560 such that the rotatable element 566 can only rotate and is restricted from translating in any direction. Thus, depending on the particular capacitor adjusting device 540, 542 or 544, a user rotates its rotatable element 566 to either effect impedance-matching or frequency-tuning of a desired channel of the probe circuit 420. In this example the resolution of the tuning, i.e., the amount of linear translation as a function of the amount of rotation, depends on the pitch of the threads. As illustrated in FIG. 9, the rotatable elements 566 are configured as axially elongated members to facilitate access and handling by the user.

In other implementations, the capacitor adjusting devices 540, 542, 544 may be configured for adjusting the distance d between upper and lower electrodes of the variable capacitors. Moreover, other means for actuating the movable capacitor electrodes 914, 916, 918 could be implemented instead of rotation-to-translation devices, such as piezoelectric motors, pushrods, etc. The capacitor adjusting devices 540, 542, 544 may be configured for manual actuation as in the present example, or alternatively for automated actuation.

Figure 10:
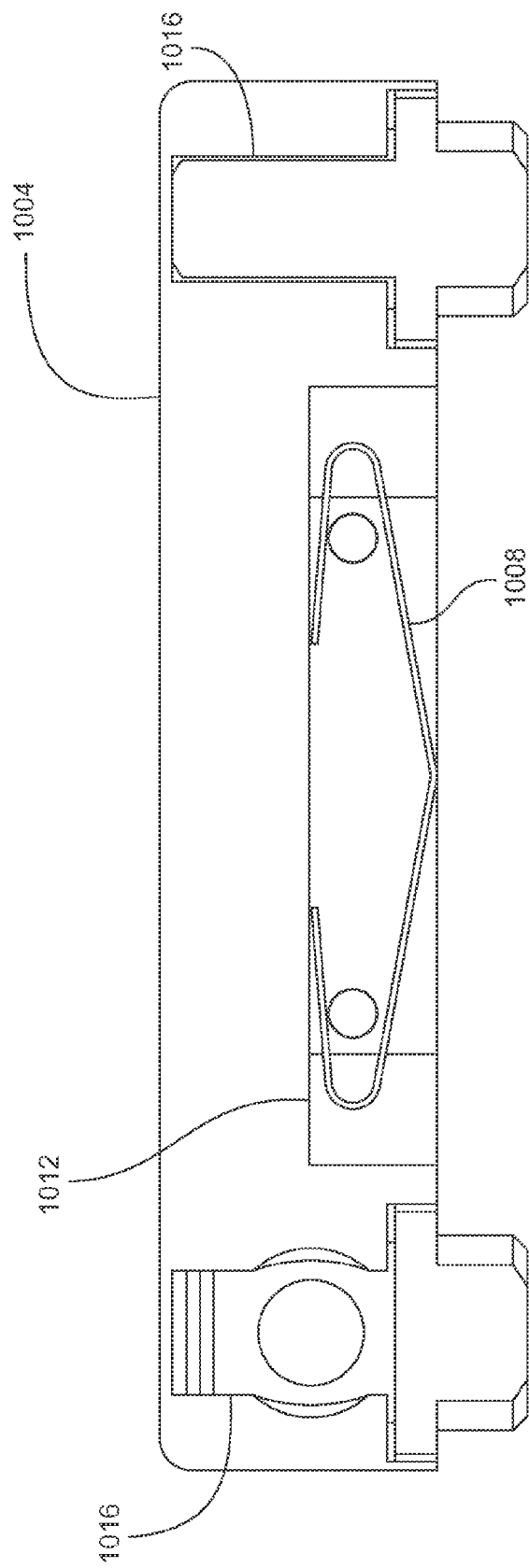
FIG. 10 is a side cross-sectional view of an example of a spring-loaded capacitor electrode that may be included with the tunable probe circuit illustrated in FIGS. 5 and 6.

As noted above, the lower capacitor electrodes 904-918 contact the second surface 616 of the dielectric substrate 512 (on the opposite side of the upper capacitor electrodes). In the present implementation, gaps between the lower capacitor electrodes 904, 906, 914, 916, 918 and the dielectric substrate 512 are avoided by providing electrically conductive springs that bias the shunted lower capacitor electrodes 904, 906, 914, 916, 918 toward the dielectric substrate 512. FIG. 10 is a side cross-sectional view of an example of a spring-loaded lower capacitor electrode 1004. An electrically conductive spring 1008 is mounted in a recess 1012 in the underside of the lower capacitor electrode 1004 for biasing the lower capacitor electrode 1004 toward the dielectric substrate 512 The spring 1008 may be composed of any suitable electrically conductive material, one non-limiting example being a beryllium-copper alloy (BeCu). The spring 1008 contacts the ground plane 504. In the case of the variable capacitors, the springs 1008 may move (e.g., slide) along respective linear grooves or tracks 970 (FIG. 9) formed in the ground plane 504, thereby maintaining straight back-and-forth motion of the movable capacitor electrodes 914, 916, and 918. In the case of the fixed capacitors, the lower capacitor electrode 1004 may additionally include mounting features 1016 for securing the lower capacitor electrode 1004 to the ground plane 504.

The ground plane assembly 900 further includes RF input ports 632, 634, for each channel (in the present example, two channels). In the present example, the RF input port 632 communicates with a proton channel and the RF input port 634 communicates with a lock channel. In the present implementation, the RF input ports 632, 634 extend through bores of the ground plane 504 via electrically insulating fixtures. At the back side of the ground plane 504, the RF input ports 632, 634 are configured for connection to coaxial cables or other suitable conductors of RF energy. A coaxial cable 636 coupled to the RF input port 632 is visible in FIG. 6. In a manner analogous to the shunted lower capacitor electrodes 904, 906, 914, 916, 918, the RF input ports 632, 634 may include spring pins (not shown) that ensure contact with the second surface 616 of the dielectric substrate 512. The RF input ports 632, 634 are thus capacitively coupled to their respective probe channels.

The ground plane assembly 900 also includes an RF output port that includes terminals 556, 558. The RF output terminals 556, 558 interconnect conductive traces 818, 820 of the circuit board 520 (or dielectric substrate 512) to conductive leads that in turn communicate with the sample coil associated with the probe circuit 420. In the present implementation, the RF output terminals 556, 558 are disposed in an electrically insulating contact block 576 that may, for example, be mounted on the ground plane 504. In the present implementation, signal communication is effected via contact pins 714, 716 (FIGS. 7 and 8) that pass through holes of the circuit board 520 and contact block 576 and into contact with the respective RF output terminals 556, 558 extending from the contact block 576.

In the present context, for convenience the terms "RF input" and "RF output" refer generally to the direction of RF excitation signals transmitted to the sample coil. It will be understood, however, that responsive RF measurement signals are received by the probe circuit 420 from the sample coil via the "RF output" terminals 556, 558 and are routed to the control/acquisition system 112 via one of the "RF input" ports 632, 634. Thus, the terms "RF input" and "RF output" are not intended to imply a limitation on the general direction of RF energy transfer through the probe circuit 420.

In the specific implementation illustrated in FIG. 9, the movable capacitor electrode 914 is part of the variable capacitor utilized to match the first (proton) channel by actuation of the capacitor adjusting device 540, and may correspond to the variable capacitor 212 shown in FIG. 2. The movable capacitor electrode 916 is part of the variable capacitors (two tuning capacitors) utilized to tune the first channel by actuation of another capacitor adjusting device 542, and may correspond to the variable capacitors 214 and 216 shown in FIG. 2. This movable capacitor electrode 916 is common to the two variable capacitors 214 and 216, while the respective first capacitor electrodes are separate as evident from the corresponding physically separate conductive traces 818 and 820 shown in FIG. 8. Hence, these two variable capacitors 214 and 216 are adjustable together by the second capacitor adjusting device 542, which configuration is also schematically depicted by the ganged arrows in FIG. 2. The movable capacitor electrode 918 is part of the variable capacitor utilized to tune the second (lock) channel by actuation of another capacitor adjusting device 544, and may correspond to the variable capacitor 218 shown in FIG. 2. The inductors 552, 554 shown in FIGS. 5-7 may correspond to those shown in FIG. 2.

From the foregoing it can be seen that a broadband probe circuit such as illustrated in FIG. 3 may likewise be implemented with the suspended substrate architecture in a manner analogous to the probe circuit 420 illustrated in FIGS. 4-10. For example, the two variable capacitors $C_t$ shown in FIG. 3 could be adjusted to tune the frequency by rotating one capacitor adjusting device to linearly translate a movable capacitor electrode common to the two variable capacitors $C_t$ that is shunted to the ground plane. This configuration is schematically depicted in FIG. 3 by the ganged arrows. The other variable capacitor $C_m$ shown in FIG. 3 could be adjusted to match impedance by rotating another capacitor adjusting device to linearly translate another movable capacitor electrode. The broadband probe circuit may also contain one or more fixed capacitors and inductors (not shown) as needed to realize this implementation, as well as an appropriate arrangement of conductive traces disposed on a common dielectric substrate.

The second tunable probe circuit 422 shown in FIG. 4 may be a broadband circuit as just described, or may be a multi-channel circuit having a configuration analogous to the first probe circuit 420, or may be a single-channel circuit. FIG. 4 illustrates examples of certain components that may be included with the second probe circuit 422, namely a second ground plane 442 separated by a second air gap from a second dielectric substrate 444 on which a patterned conductive layer (a second plurality of electrically conductive traces) is disposed, a movable capacitor electrode 446 disposed in the air gap between the second ground plane 442 and second dielectric substrate 444 that is translated by a capacitor adjusting device 448, an inductor 450, etc. The movable capacitor electrode 446 may be configured in the second probe circuit 422 for tuning to two or more selected resonance frequencies in the broadband range made available. Another movable capacitor electrode and associated capacitor adjusting device (not shown) may be provided for impedance matching.

An NMR probe circuit having a two-dimensional topology and suspended substrate architecture such as described above lends itself well to the application of solid modeling, simulation, and manufacture. There is a correspondence between the physical dimensions, positions and arrangement of the mechanical components and the frequency response. It may be straightforward to make a change to the mechanical design, run a circuit simulation to determine the effect this change will have on the RF response, have new components made, and re-assemble a new prototype incorporating these changes. Depending on the design issue being dealt with, it may be preferable to start with the simulation and utilize the simulated output to drive the mechanical design.

In one example of a design process, circuit models for the inductors employed in the design were developed by building a test fixture that mimicked the probe layout, measuring the inductor in this fixture, de-embedding the measurement, and fitting to an appropriate model. Component models thus developed were combined to produce an overall model of the probe circuit that was utilized to optimize the design and determine capacitor geometry. Combining the measured models for the inductor with broadside coupled stripline models (for the capacitors) and an S parameter representation of the sample coils yielded a complete probe model. The capacitive elements were also amenable to electromagnetic simulation.

From the foregoing it can be seen that the subject matter disclosed herein effectively addresses problems attending NMR probe circuits, e.g., poor reproducibility, expensive repair, and long design cycles. In addition, the present subject matter enables straightforward application of commonly utilized simulation packages. Reproducibility is improved because the circuit components are restricted in their respective locations, which stabilizes couplings between individual components and between each component and ground. Repair is simpler and less expensive because one may just swap out an entire probe circuit or even the entire circuit assembly in minutes. Design cycles are shorter because simulation may be employed, which is usually much faster than typical prototyping processes. The presently disclosed circuit topology allows a deterministic design approach to be employed instead of prototyping and thereby facilitates all stages of the design, manufacture and repair of the circuits and related hardware. Furthermore, the present implementations obviate the need for employing ceramic chip capacitors. Chip capacitors are conventionally utilized in commercial cold probe designs, but are not rated for cryogenic use and may cause reliability issues. The variable capacitors configured as disclosed herein are adjustable over a large range of capacitance values.

While the various layers and planes (e.g., dielectric layer, ground plane, circuit board, etc.) are depicted in the drawing figures as being flat, it will be understood that the present teachings encompass curved layers and planes.

In general, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

For purposes of the present disclosure, it will be understood that when a layer (or film, region, substrate, component, device, or the like) is referred to as being "on" or "over" another layer, that layer may be directly or actually on (or over) the other layer or, alternatively, intervening layers (e.g., buffer layers, transition layers, interlayers, sacrificial layers, etch-stop layers, masks, electrodes, interconnects, contacts, or the like) may also be present. A layer that is "directly on" another layer means that no intervening layer is present, unless otherwise indicated. It will also be understood that when a layer is referred to as being "on" (or "over") another layer, that layer may cover the entire surface of the other layer or only a portion of the other layer. It will be further understood that terms such as "formed on" or "disposed on" are not intended to introduce any limitations relating to particular methods of material transport, deposition, fabrication, surface treatment, or physical, chemical, or ionic bonding or interaction. The term "interposed" is interpreted in a similar manner.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. A nuclear magnetic resonance (NMR) probe circuit assembly, comprising:
   a ground plane;
   a dielectric substrate separated from the ground plane by an air gap;
   a plurality of electrically conductive traces disposed on a surface of the dielectric substrate opposite to the air gap, and comprising a stationary capacitor electrode;
   a movable capacitor electrode interposed between the ground plane and the dielectric substrate, in movable contact with the ground plane and the dielectric substrate, and movable in variable overlapping relation with the stationary capacitor electrode, wherein the movable capacitor electrode, the dielectric substrate, and the stationary capacitor electrode form a variable capacitor configured for tuning the NMR probe circuit assembly to a resonance frequency; and a capacitor adjusting device configured for moving the movable capacitor electrode relative to the stationary capacitor electrode in response to actuation.

2. The NMR probe circuit assembly of claim 1, wherein the stationary capacitor electrode comprises a first conductive trace and a physically separate second conductive trace, and the movable capacitor electrode is movable in overlapping relation with both the first conductive trace and the second conductive trace.

3. The NMR probe circuit assembly of claim 2, comprising a radio-frequency (RF) port mounted in electromagnetic isolation from the ground plane and configured for transferring RF signals between the NMR probe circuit assembly and the sample coil, the RF port comprising a first terminal in signal communication with the first conductive trace and a second terminal in signal communication with the second conductive trace, wherein the variable capacitor comprises two tuning capacitors coupled in parallel with the sample coil.

4. The NMR probe circuit assembly of claim 1, wherein the movable capacitor electrode comprises an electrically conductive spring in movable contact with the ground plane and configured for biasing the movable capacitor electrode into contact with the dielectric substrate.

5. The NMR probe circuit assembly of claim 1, comprising an electrically insulating structural layer and a spacer interposed between the ground plane and the structural layer, wherein the dielectric substrate is affixed to the structural layer, the structural layer is attached to the spacer, and the spacer defines a distance of the air gap.

6. The NMR probe circuit assembly of claim 1, wherein the electrically conductive traces are attached to the dielectric substrate.

7. The NMR probe circuit assembly of claim 1, comprising a circuit board disposed on the dielectric substrate, wherein the electrically conductive traces are attached to the circuit board and in contact with the dielectric substrate.

8. The NMR probe circuit assembly of claim 1, wherein the variable capacitor is part of a first probe channel of the NMR probe circuit assembly configured for resonantly coupling with a high-frequency nucleus, and further comprising a second probe channel configured for resonantly coupling with a low-frequency nucleus.

9. The NMR probe circuit assembly of claim 8, wherein the variable capacitor of the first probe channel is a first variable capacitor, the movable capacitor electrode of the first probe channel is a first movable capacitor electrode, the stationary capacitor electrode of the first probe channel is a first stationary capacitor electrode, and the capacitor adjusting device configured for moving the first movable capacitor electrode is a first capacitor adjusting device, and wherein the second probe channel comprises:

a second movable capacitor electrode interposed between the ground plane and the dielectric substrate, in movable contact with the ground plane and the dielectric substrate, and movable in variable overlapping relation with a second stationary capacitor electrode of the plurality of electrically conductive traces, wherein the second movable capacitor electrode, the dielectric substrate, and the second stationary capacitor electrode form a second variable capacitor configured for tuning the second probe channel to a resonance frequency of the low-frequency nucleus; and a second capacitor adjusting device configured for moving the second movable capacitor electrode relative to the second stationary capacitor electrode in response to actuation.

10. The NMR probe circuit assembly of claim 9, wherein the second variable capacitor is tunable to a resonance frequency of deuterium.

11. The NMR probe circuit assembly of claim 9, wherein the ground plane, the dielectric substrate, the plurality of electrically conductive traces, the first variable capacitor, the first capacitor adjusting device, the second variable capacitor, and the second capacitor adjusting device are part of a first probe circuit of the NMR probe circuit assembly, and further comprising a second probe circuit physically separate from the first probe circuit, wherein the first probe circuit is configured for signal communication with a first sample coil, and the second probe circuit is configured for signal communication with a second sample coil and is tunable to a resonance frequency of a low-frequency nucleus of a different type than the second probe channel.

12. The NMR probe circuit assembly of claim 11, wherein the ground plane of the first probe circuit is a first ground plane, the dielectric substrate of the first probe circuit is a first dielectric substrate, and the plurality of electrically conductive traces of the first probe circuit is a first plurality of electrically conductive traces, and wherein the second probe circuit comprises:

a second ground plane;
a second dielectric substrate separated from the second ground plane by a second air gap;
a second plurality of electrically conductive traces disposed on a surface of the second dielectric substrate opposite to the second air gap, and comprising a third stationary capacitor electrode;
a third movable capacitor electrode interposed between the second ground plane and the second dielectric substrate, in movable contact with the second ground plane and the second dielectric substrate, and movable in variable overlapping relation with the third stationary capacitor electrode, wherein the third movable capacitor electrode, the second dielectric substrate, and the third stationary capacitor electrode form a third variable capacitor configured for tuning the second probe circuit to a resonance frequency of the nucleus of the different type; and
a third capacitor adjusting device configured for moving the third movable capacitor electrode relative to the third stationary capacitor electrode in response to actuation.

13. The NMR probe circuit assembly of claim 1, wherein the variable capacitor is tunable over a frequency range that includes a resonance frequency of a proton and a resonance frequency of a $^{19}F$ nucleus.

14. The NMR probe circuit assembly of claim 1, wherein the variable capacitor is tunable over a frequency range that includes respective resonance frequencies of at least two different low-frequency nuclei.

15. The NMR probe circuit assembly of claim 1, wherein the variable capacitor configured for tuning the NMR probe circuit assembly to the resonance frequency is a first variable capacitor, the movable capacitor electrode of the first variable capacitor is a first movable capacitor electrode, the stationary capacitor electrode of the first variable capacitor is a first stationary electrode, and the capacitor adjusting device configured for moving the first movable capacitor electrode is a first capacitor adjusting device, and further comprising:

a second movable capacitor electrode interposed between the ground plane and the dielectric substrate, in movable contact with the ground plane and the dielectric substrate, and movable in variable overlapping relation with a second stationary capacitor electrode of the plurality of electrically conductive traces, wherein the second movable capacitor electrode, the dielectric substrate, and the second stationary capacitor electrode form a first variable capacitor configured for impedance matching between a sample coil and a transmission line communicating with the NMR probe circuit assembly; and a second capacitor adjusting device configured for moving the second movable capacitor electrode relative to the second stationary capacitor electrode in response to actuation.

16. The NMR probe circuit assembly of claim 1, wherein the ground plane, the dielectric substrate, the plurality of electrically conductive traces, the variable capacitor and the first capacitor adjusting device are part of a first probe circuit of the NMR probe circuit assembly, and further comprising a second probe circuit physically separate from the first probe circuit, wherein the first probe circuit is configured for signal communication with a first sample coil and is tunable to a resonance frequency of a nucleus of a first type, and the second probe circuit is configured for signal communication with a second sample coil and is tunable to a resonance frequency of a nucleus of a second type.

17. The NMR probe circuit assembly of claim 16, wherein the ground plane of the first probe circuit is a first ground plane, the dielectric substrate of the first probe circuit is a first dielectric substrate, and the plurality of electrically conductive traces of the first probe circuit is a first plurality of electrically conductive traces, and wherein the second probe circuit comprises:

a second ground plane;

a second dielectric substrate separated from the second ground plane by a second air gap;

a second plurality of electrically conductive traces disposed on a surface of the second dielectric substrate opposite to the second air gap, and comprising a second stationary capacitor electrode;

a second movable capacitor electrode interposed between the second ground plane and the second dielectric substrate, in movable contact with the second ground plane and the second dielectric substrate, and movable in variable overlapping relation with the second stationary capacitor electrode, wherein the second movable capacitor electrode, the second dielectric substrate, and the second stationary capacitor electrode form a second variable capacitor configured for tuning the second probe circuit to a resonance frequency of the nucleus of the second type; and a second capacitor adjusting device configured for moving the second movable capacitor electrode relative to the second stationary capacitor electrode in response to actuation.

18. The NMR probe circuit assembly of claim 16, wherein:

the first probe circuit is tunable to a frequency selected from the group consisting of a resonance frequency of a proton, a resonance frequency of a $^{19}$F nucleus, and a frequency range that includes the resonance frequency of the proton and the resonance frequency of the $^{19}$F nucleus; and the second probe circuit is tunable to a frequency selected from the group consisting of a resonance frequency of a low-frequency nucleus, and a frequency range that includes respective resonance frequencies of at least two different low-frequency nuclei.

19. The NMR probe circuit assembly of claim 16, wherein the variable capacitor is part of a first probe channel of the first probe circuit configured for resonantly coupling with a high-frequency nucleus, and the first probe circuit further comprises a second probe channel configured for resonantly coupling with a low-frequency nucleus.

20. The NMR probe circuit assembly of claim 19, wherein:

the first probe channel is tunable to a frequency selected from the group consisting of a resonance frequency of a proton, a resonance frequency of a $^{19}$F nucleus, and a frequency range that includes the resonance frequency of the proton and the resonance frequency of the $^{19}$F nucleus;

the second probe channel is tunable to a resonance frequency of deuterium; and the second probe circuit is tunable to a frequency selected from the group consisting of a resonance frequency of a low-frequency nucleus other than deuterium, and a frequency range that includes respective resonance frequencies of at least two different low-frequency nuclei other than deuterium.

* * * * *